United States Patent [19]

Zapka et al.

[11] Patent Number: 4,855,197
[45] Date of Patent: Aug. 8, 1989

[54] MASK FOR ION, ELECTRON OR X-RAY LITHOGRAPHY AND METHOD OF MAKING IT

[75] Inventors: Werner Zapka, Gaertringen-Rohrau; Jürgen Kempf, Gechingen; Joachim Keyser, Wildeberg; Karl Asch, Herrenberg-Gültstein, all of Fed. Rep. of Germany

[73] Assignee: International Business Machines Corporation, Armonk, N.Y.

[21] Appl. No.: 44,929

[22] Filed: May 1, 1987

[30] Foreign Application Priority Data

May 6, 1986 [EP] European Pat. Off. ........ 86106188.5

[51] Int. Cl.$^4$ ................................. G03F 9/00
[52] U.S. Cl. ........................................ 430/5; 430/313; 430/323; 430/966; 156/643; 156/662; 250/492.2; 250/505.1; 378/35; 427/38
[58] Field of Search ................ 156/643, 662; 250/492.20, 492.30, 505.1, 482.1; 378/35; 427/38; 430/5, 313, 323, 906, 927, 9

[56] References Cited

U.S. PATENT DOCUMENTS

| | | | |
|---|---|---|---|
| 3,742,230 | 6/1973 | Spears et al. | 430/5 |
| 4,342,817 | 8/1982 | Bohlen et al. | 430/5 |
| 4,393,127 | 7/1983 | Greschner et al. | 430/966 |
| 4,417,946 | 11/1983 | Bohlen et al. | 430/313 |
| 4,448,865 | 5/1984 | Bohlen et al. | 430/323 |
| 4,451,544 | 5/1984 | Kawabuchi | 430/313 |
| 4,468,799 | 8/1984 | Harms et al. | 430/5 |
| 4,589,952 | 5/1986 | Behringer et al. | 156/653 |
| 4,640,844 | 2/1987 | Neppl et al. | 427/38 |
| 4,647,517 | 3/1987 | Hersener et al. | 430/5 |

FOREIGN PATENT DOCUMENTS

| | | | |
|---|---|---|---|
| 0093785 | 2/1978 | Japan | 430/5 |
| 0016136 | 2/1981 | Japan | 430/5 |
| 0022433 | 3/1981 | Japan | 430/5 |

OTHER PUBLICATIONS

IBM TDB vol. 26, No. 7A, Dec. 1983 "Shadow Projection Mask for X-Ray, Ion and Electron Beam Lithography".
J. Vac. Sci. Techno. B 3(1), Jan./Feb. 1985, pp. 136–139.
"Electron Beam Proximity Printing: Complementary-Mask and Level-To-Level Overlay With High Accuracy".

Primary Examiner—José G. Dees
Assistant Examiner—Donald J. Loney
Attorney, Agent, or Firm—Graham S. Jones, II

[57] ABSTRACT

A mask for radiation beam lithography is formed from a semiconductor wafer by thinning a region into a membrane with a hole pattern defining the pattern of the mask. The membrane is doped with a tensile stress-generating material so that minimum doping exists at the periphery of the membrane with the maximum at its center. The difference in doping between the periphery and the center is chosen so that when the mask is irradiated with a given beam current intensity, the membrane is tension-free. To make a mask in the wafer, a hole pattern is formed by etching holes in the membrane or by depositing a layer on the membrane. The wafer is thinned from the opposite surface until the holes in the hole pattern are throughholes or until the desired thickness is reached. The membrane is doped with tensile-stress-generating material using ion implantation or diffusion proportionally to the temperature distribution existing in the membrane during irradiation with exposure beams.

20 Claims, 3 Drawing Sheets

MASK FOR ION, ELECTRON OR X-RAY LITHOGRAPHY AND METHOD OF MAKING IT

BACKGROUND OF THE INVENTION

1. Field of the Invention

The invention relates to a mask for ion, electron or X-ray radiation beam lithography, which comprises a planar semiconductor wafer, and more particularly to such a mask in the form of a thin membrane. This invention also relates to a method of making such a mask.

Such masks are used to transfer the mask pattern (usually reduced by a factor of a 5) by means of projection irradiation with ions, electrons or X-rays into a photoresist layer.

2. Description of Related Art

A mask pattern deposited on a membrane is described in U.S. Pat. No. 3,742,230, and a mask pattern defined through a mask pattern generated in the membrane is described in European Patent No. 0 019 779 and corresponding U.S. Pat. No. 4,417,946 of Bohlen et al entitled "Method of Making Mask for Structuring Surface Areas". The methods for making such masks are described in the above-cited patents.

In the above European Patent the membrane carrying the mask is boron-doped. The effect of such boron doping is a high tensile stress in the thinned layer, with the consequence that the wafer is bent. In such cases where microminiaturized patterns of very high packing density are to be transferred with the mask, such bending cannot be tolerated. In the article "Shadow Projection Mask for X-Ray, Ion and Electron Beam Lithography" by J. Greschner et al., published in IBM Technical Disclosure Bulletin, Volume 26, No. 7A, December 1983, Page 3263, a solution for this problem is discussed which consists in that the 2–3 μm thick boron doping is produced only in those regions of the semiconductor wafer which are subsequently thinned or where the mask pattern will be produced, respectively. Irrespective of whether the doped layer is a blanket coating over the one surface of the semiconductor wafer, or only over regions thereof, the thinned regions are tensioned owing to the tensile stress caused by the boron; and if noticeable warping of the semiconductor wafer is excluded, they are planar. Buckling of the membrane occurs only under the influence of a sufficiently high doping-dependent temperature. During the "Symposium on the Eighth International Conference on Electron and on Ion Beam Science and Technology" (1978) H. Bohlen et al lectured on the fact that upon a surface concentration of the boron of $10^{19}$ atoms/cm$^{-3}$, the thin layer buckles at approximately 120° C.

P. Nehmiz et al. "Electron Beam Proximity Printing: Complementary-Mask and Level-to-Level Overlay with High Accuracy" J. Vac. Sci. Technol. B, Vol. 3 (1) January/February 1985 (136–139) also published as the Proceedings of the 1984 International Symposium on Electron, Ion and Photon Beams, Tarrytown, N.Y., USA (1984), reported on mask distortion connected with the method used for making the masks. According to this method, the mask pattern is generated in or on the doped layer prior to thinning. As in this stage of the production, the doped layer is connected to the remaining substrate over its entire width, which prevents effects of the tensile stress, the transferred pattern is a true image of the desired pattern. If there is subsequent selective thinning, the tensile stress in the membrane which is now fixed only at its periphery causes a distortion of the pattern in a mask plate. This so-called "cold distortion" equals zero in the center and in the periphery of the membrane, and it is at a maximum in a zone being closer to the center than to the periphery. The "cold distortion" can be compensated by a corresponding doping with a material generating pressure tension in the silicon. The quantity of doping material required for compensating the "cold distortion" depends on the temperature. To give an example: If at a temperature of 40° C. the membrane is to be tension-free and thus undistorted, the quantity required is lower than if the membrane is to be tension-free at 20° C. An undistorted and planar pattern however is achieved only if this predetermined temperature can be maintained over the entire membrane. However, if the masks are to be used in accordance with their purpose, i.e. in the irradiation with ion, electron and X-rays, it is not possible to achieve a uniform temperature over the thinned layer. In fact, the membrane will always be hotter in its center than in its periphery. The uncompensatable distortion increases with the temperature difference between the periphery and the center.

In electron beam exposure it is known to keep the maximum beam current at such a low level (1≧10 microamperes), that the temperature increases T are not higher than approximately 10° C.; and in X-ray lithography, mask heating during exposure is prevented by a helium atmosphere in the environment which ensures exhausting of the heat generated in the mask. This helium atmosphere has some disadvantages. On the one hand, owing to the absorption of X-rays it limits the spectrum available for lithography. On the other hand, it involves considerable (safety) technical efforts since by means of several pressure stages the helium pressure has to be successively adapted to the high vacuum at the site of the X-ray source. During operation, extremely high-speed valves must assure that should a window burst there will be no gas breaking-in at the site of the source.

OBJECTS OF THE INVENTION

It is the object of the invention to provide a mask for ion, electron or X-ray lithography. The mask comprises a regionally thinned semiconductor wafer, with the mask pattern being formed on or in the thinned regions. It should permit the distortion-free transfer of a desired pattern without requiring very low beam currents. It also should not require a very complex cooling system.

SUMMARY OF THE INVENTION

The tensile stress-producing doping does not refer to the total of atoms which owing to their atomic diameter are able to generate tensile stress in the membrane, but only to those whose effect is not compensated by atoms generating pressure stress.

If a mask according to this invention, whose tensile stress-generating doping is adapted to a predetermined beam current, is exposed to this beam current, there results the same undistorted mask pattern as prior to the thinning of the mask substrate. This applies also in those cases where the temperature differences appearing in the membrane are considerable. Therefore, a mask according to this invention is able to transfer, with a high throughput, a desired mask pattern in a pattern-true mode e.g. into photoresist layers, with no complex cooling systems being required.

The effect achieved with the mask can be called "pseudo-cooling" because the doping which generates the tensile stress can eliminate, at least partly, a pressure stress in the membrane in the same manner as cooling. There exists an almost linear correlation between the temperature reduction and the increasing tensile stress on the one hand and between the increasing doping and the increasing tensile stress on the other, as found particularly for doping between $10^{19}$ and $10^{20}$ boron atoms/cm$^3$. If for the specific beam current the temperature profile is known which is determined by thickness and surface of the thin layer and surface of the holes determining the mask pattern, or of the mask pattern consisting of a highly conductive metal, respectively, the doping profile required for correcting the distortion is known, too, excluding one factor. This factor can be determined by uncomplicated tests known to an expert, the criterion for the correct doping is the absence of mechanical tension in the irradiated state. The temperature profile upon irradiation of the membrane, and the profile of the doping required for ensuring the absence of mechanical tension is depicted in FIG. 4 for a specific beam current.

It is of advantage to select a tensile stress generating doping which is slightly lower than necessary to reduce the tension to zero. Although a slight distortion then has to be taken into account, it avoids the risk connected with a precise adaptation of the doping profile to the temperature profile, i.e. that even a small additional temperature rise will cause buckling of the membrane.

In a preferred embodiment of the mask as disclosed by the invention the membrane comprises the following:

1. Doping assures that there remains a 2-3 μm thick membrane in the thinning of the semiconductor wafer (doping for etch stop). (If the wafer has p-doping or n-doping this doping can be p$^+$-doping with boron or, if the wafer is n$^+$-doped it can be n-doping with phosphorus);

2. Doping which reduces mechanical tensions caused by the first doping at room temperature to zero; and 3. Doping, e.g. of boron, which generates a tensile stress and is adapted to heating upon irradiation.

It is assumed in this embodiment that the membrane periphery can be maintained at room temperature during irradiation. Should this not be possible, the doping mentioned above under item 3. above has to be superimposed with another uniform doping corresponding to the additional heating, with the tensile stress-generating material.

Membrane doping in accordance with the invention can be effected, either by means of out-diffusing already built-in-atoms, by means of diffusion, or by means of ion implantation.

If doping according to this invention is to take place by means of diffusion, one method is as follows: After the membrane has been processed in such a manner that it is tension-free at room temperature, a non-uniform temperature profile (comparable to curve in FIG. 2) is generated in the membrane by irradiation. The temperature in the membrane periphery is just below the value where the doping material provided has a considerable diffusion constant in the semiconductor material. Subsequently, there is a diffusion process, with the doping in the center of the membrane being higher than at the periphery as the diffusion rates depend on the temperature. A less complex apparatus is required for doping by means of ion implantation, where the ion beam together with the ions from the doping material is guided line-by-line over the membrane until finally each membrane spot has been irradiated. Depending on each particular location, in accordance with the respective doping profile, the ion intensity or the beam motion speed, respectively, is varied simultaneously under computer control.

In the relatively frequent case of etch stop doping with boron, i.e. with a material generating tensile stress, the doping in accordance with the invention can also be effected in that doping takes place either with a pressure tension-generating material according to a profile inverse to the profile shown in curve b of FIG. 3, or by covering the thinned layer with a layer of a slightly boron-permeable material, with a thickness distribution proportional to that shown in curve b of FIG. 3. Then one out-diffuses the boron by heating, which owing to the varying thicknesses causes a locally different boron loss.

In the following the invention is described with reference to drawings specified by examples.

DESCRIPTION OF THE PREFERRED EMBODIMENT

In the following, a mask according to this invention is discussed with reference to FIGS. 1 and 2. In its geometrical dimensions, the mask according to this invention is practically identical with the known masks.

Figure 1:
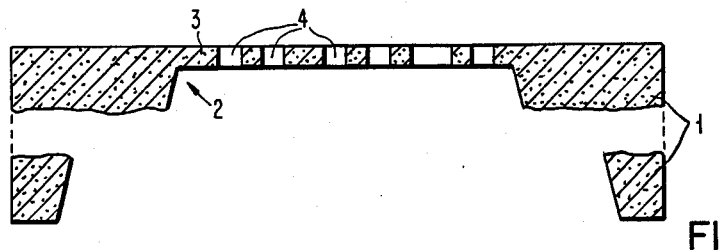
FIGS. 1 and 2 are schematic elevational views taken as cross-sections through two embodiments of masks in accordance with this invention.

FIG. 1 is a schematic, partial cross-section of a wafer 1. Preferably wafer 1 consists of silicon, but wafer 1 can also be made of any other semiconductor material. Usually, wafer 1 is 300-400 μm thick. From the lower surface of wafer 1 an inverted tub-shaped depression 2 extends into silicon wafer 1. The "floor" of the inverted tub-shaped depression is a 2-3 μm thick membrane 3 which is coplanar with the other surface of wafer 1.

Into membrane 3, a pattern of throughholes 4 is etched which defines a mask pattern, in accordance with mask features described in the prior art. The mask is used for transferring fixed mask patterns into a photoresist layer by means of ions, electrons and X-rays. Throughholes 4 in mask 1 are required when ion beams and electron beams are used since such particles are strongly absorbed in solid matter. As a pattern of throughholes cannot have any annular holes, and as such pattern elements are usually required in a mask, two complementary masks are generally employed for transferring the patterns into the photoresist layer. The hole patterns of such complementary masks are such that, provided both masks are projected one over the other in correct alignment (i.e. superimposed), the desired resultant pattern is obtained. The hole elements are distributed over both complementary masks in such a way that the overall surface of holes on both masks is approximately equal, and so that there is an approximately uniform hole distribution over the mask surface. From various aspects it is advantageous to provide the hole patterns for both complementary masks on one membrane 3.

Figure 2:
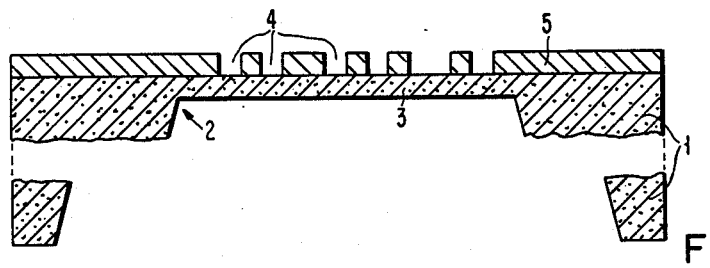

The mask of FIG. 2 differs from that of FIG. 1 only in that the hole pattern 14 is provided in a layer 15 which is deposited on a wafer 11 and preferably consists of gold, and in that membrane 13 forms a blanket layer. The mask of FIG. 2 is used for transferring mask patterns by means of X-rays. As X-rays have a much lower rate of absorption in solid matter than electron beams and ion beams it is not necessary to provide a mask with throughholes. In a mask like the one of FIG. 2 the above mentioned problem connected with annular transparent mask regions is not encountered; therefore, one mask will be sufficient for transferring the pattern.

Figure 3:
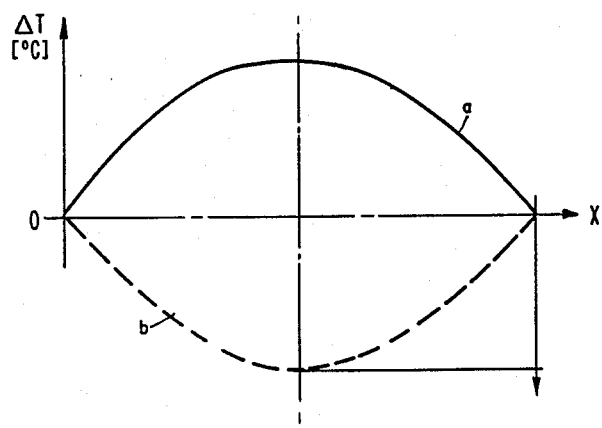
FIG. 3 is a diagram, plotted for membranes of FIGS. 1 and 2 along the cross sections. Curve a shows the temperature differences appearing upon radiation. Curve b shows the doping in accordance with this invention by which, in spite of irradiation and the temperature difference in accordance with curve a, a tension-free membrane is achieved.

A mask according to this invention differs from those of the prior art in that it provides a defined doping of membrane 3, 13. Under irradiation conditions the masks have to ensure a high pattern fidelity in the transfer of the respective mask pattern. With increasing microminiaturization, and the equally increasing packing density of circuit elements in integrated circuits the demands to pattern fidelity in the transfer increase, too, i.e. the admissible tolerances are reduced continuously. Under irradiation conditions the prior art masks show a bending of membrane 3, 13 out of the mask plane, or a distortion of the mask pattern in the mask plane. In that context, distortion of the mask pattern means a shifting of at least parts of the mask elements from their fixed position, as well as the modification of their predetermined shape. Bending cannot be accepted under any circumstances. Bending can be prevented or canceled through a homogeneous doping of membrane 13 with a material which, as e.g. boron, causes tensile stress in silicon. In the most frequently used masks of prior art, such boron doping is provided at any rate, at least in membrane 3, 13 for manufacturing reasons. The homogeneous doping of membrane 3, 13, however can never prevent a distortion of the mask pattern under irradiation conditions. This would be possible only in those cases where membrane 3, 13 has a uniform temperature during radiation which however does not apply here. In fact, when it is irradiated, membrane 3, 13 has a temperature maximum in its center and a minimum in its periphery. The temperature difference within the mask membrane increases with the amplitude of the beam current used. With increasing microminiaturization, the acceptable distortions of the mask patterns are becoming increasingly smaller. Apart from the complicated and highly complex mask cooling, hitherto this could be taken into account only in that the beam current was strongly reduced, with the undesirable result of a very small throughput. Curve a in FIG. 3 schematically depicts the temperature distribution during irradiation the lengths of the cross sections of FIGS. 1 and 2. The temperature difference locally appearing in the membrane 3, 13 upon irradiation is proportional to a corresponding pressure tension. It has now been found that this pressure tension can be fully compensated by a corresponding doping of membrane 3,13 with an element having a smaller covalent atomic radius than silicon (these elements include, apart from boron, e.g. phosphorus and carbon). In the mask according to the invention, membrane 13 is doped in a predetermined mode adapted to a specific beam current and consequently to a specific temperature profile. Curve b in FIG. 3 schematically depicts the doping profile shown in the membranes of FIGS. 1 and 2 following approximately a parabolic function. It should be made clear that the doping profile of FIG. 3 does not cover the entire quantity of tensile stress generating material possibly existing in membrane 3, 13, but only that tensile stress generating material which is not compensated by counterdoping. In the following, by means of a specific example, the mask according to invention in the design of FIG. 1 will be discussed with more detail with reference to the doping profile of FIG. 4.

Figure 4:
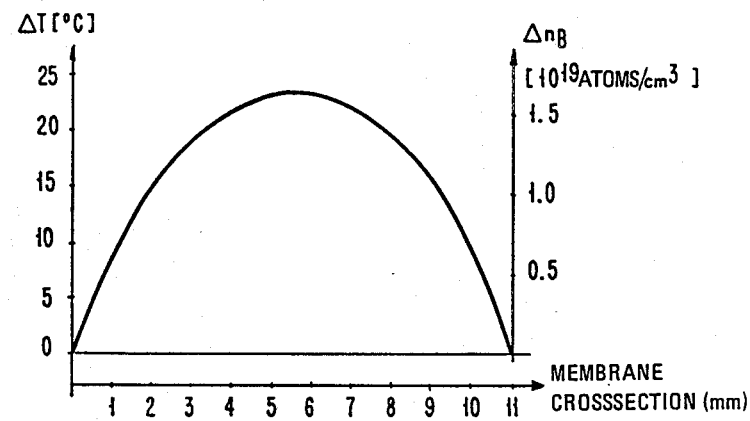
FIG. 4 shows the temperature profile vs cross section of membrane of curve b of FIG. 3 for a predetermined beam current.

The semiconductor wafer of FIG. 4 consists of silicon, and the membrane surface has a size of $11 \times 11$ cm$^2$ and a thickness of 2 $\mu$m. The holes are uniformly distributed over the membrane and their overall surface amounts to approximately 40% of the membrane surface. During the production of the mask, the membrane had already been uniformly doped with boron. In a later process step, this boron doping had been compensated by means of uniform germanium doping to such an extent that the membrane had been tension-free at room temperature. The membrane is additionally boron-doped in accordance with the profile of FIG. 4. As indicated by the diagram of FIG. 4, the maximum-additional-boron concentration is in the range of $1.66 \times 10^{19}$/cm$^3$. The mask was exposed to a beam current of 10 microamperes. Under these conditions the temperature difference between the center and the periphery of the membrane amounted to 23.5° C., with the periphery having a temperature of approximately 27° C. Measurement of the mechanical tension in the membrane according to the method described below in connection with the mask production revealed that under these irradiation conditions the mask was tension-free.

Figure 5:
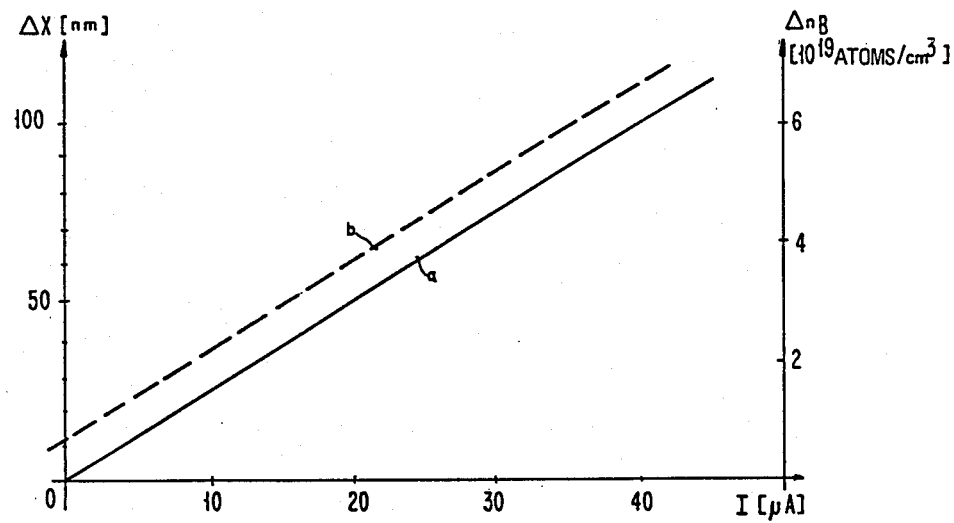
FIG. 5 is a diagram plotted over the beam current impinging on the mask. On the one hand curve a shows the maximum distortion appearing in the mask membrane in the absence of the doping according to the invention. On the other hand it shows the boron doping difference between the center and the periphery of the membrane, through which the distortion of the corresponding beam current is prevented either completely (also curve a) or to the exclusion of a defined remainder (broken curve b).

For masks corresponding in their geometric dimensions with the mask described in the present example the correlation between beam current and the necessary boron doping difference between the center and the periphery of the membrane ensuring the absence of tension, is shown in FIG. 5. The associated doping profile is geometrically similar to that of FIG. 4. In FIG. 5, the maximum thermal distortion is additionally illustrated which would appear if there were no additional non-uniform doping. In parallel to the solid line a, FIG. 5 also shows a broken line b. If in a fixed beam current a maximum doping difference is generated which corresponds to the broken line b, there remains a residual distortion in the membrane of a maximum of 10 nm under irradiation conditions. This is the distortion which is marginally acceptable under present-day level of microminiaturization. It is advisable to dope a mask with a slightly higher rate than would correspond to the beam current to be used. Otherwise if the doping is adapted too precisely to the beam current and consequently to the resulting temperature difference, there is a risk of the membrane buckling out of the mask plane if a critical temperature were exceeded slightly. However, this is to be avoided absolutely. The optimum doping difference of a mask for a predetermined beam current is therefore between the value on solid line and that on the broken line b.

BEST MODE OF CARRYING OUT THE INVENTION

In forming the mask, the same methods are applied at first as in the production of the known masks.

Preferably, operations start with a semiconductor wafer. In the following description, this semiconductor wafer consists of monocrystalline silicon, preferably with a (100)-orientation, with n-doping or p-doping. However, the wafer does not have to consist of silicon, and the given doping is not obligatory, either—e.g. the silicon could also be $n^+$-doped. The thickness of the silicon wafer is between approximately 100 $\mu$m and approximately 400 $\mu$m. One of the silicon wafer surfaces is highly doped with an impurity p-conductivity. Boron is used advantageously as an impurity. For doping, impurity ions are either implanted in a known manner, or diffused into the wafer. On doping of the wafer, a $p^+$-doped surface layer is formed whose thickness has been defined as that distance from the surface for which in case of boron in silicon the doping concentration amounts to $7 \times 10^{19}$ impurity atoms/cm$^3$. The highly doped layer does not dissolve in specific solutions preferably etching low-doped silicon. This characteristic is important for the thinning of the silicon wafer which will be described in a later process step. (If in the mask production an $n^+$-doped silicon wafer is assumed, a thin, n-doped surface layer is generated, through doping with a material inducing p-conductivity. The surface layer is practically not attacked by the etchant for $n^+$-doped material in a later thinning process). From the highly doped surface the mask pattern is subsequently etched into the silicon wafer.

Etching is preferably performed by means of reactive ion etching after an etching mask reproducing the mask pattern has been formed photolithographically in a layer covering the surface. The layer consists of photoresist, silicon dioxide, a metal, or of a layer combination of such materials. Details concerning etching are given in European Patent No. 0 019 779. The depth of the etching is greater than the thickness of the highly doped layer. In the region of the etched pattern, the silicon wafer is now thinned in that, from the other surface of the wafer, a tub-shaped depression 2, 12 is etched therein. Etching is preferably performed with a solution consisting of ethylenediamine, pyrocatechol, water and optionally hydrogen peroxide.

The etching front is stopped practically where the doping concentration in the previously generated, highly doped layer exceeds $7 \times 10^{19}$ impurity atoms/cm$^3$, i.e. the remaining layer is thinned than the etching depth of the hole pattern. Consequently, there now exists, within the silicon wafer acting as a frame, a $p^+$-doped thin layer with a pattern of throughholes. Thin etching details are also described in European Patent No. 0 019 779.

Since boron, as specified above, generates a tensile stress in the silicon, the mask pattern in the thin layer is distorted when it is no longer fixed by the low-doping material of the remaining silicon wafer. Therefore, in the next process step the silicon wafer has to be rendered tension-free. For example, this can be effected through homogeneous doping with a material having a greater covalent atomic diameter than silicon. Such materials include arsenic and germanium.

Measurement for the absence of tensions is based on the following consideration. A silicon membrane mechanically prestressed by boron doping and provided in an non-tensioned silicon frame is under strong internal tensile force. If the silicon membrane is now irradiated, e.g. through a flood light, with the frame being covered, it expands due to heating and thus reduces the internal mechanical prestressing. With a sufficient extent of heating, thermal expansion overcompensates the internal tensile force. Overcompensation causes buckling of the silicon membrane in the vertical direction with respect to the mask surface.

Figure 6:
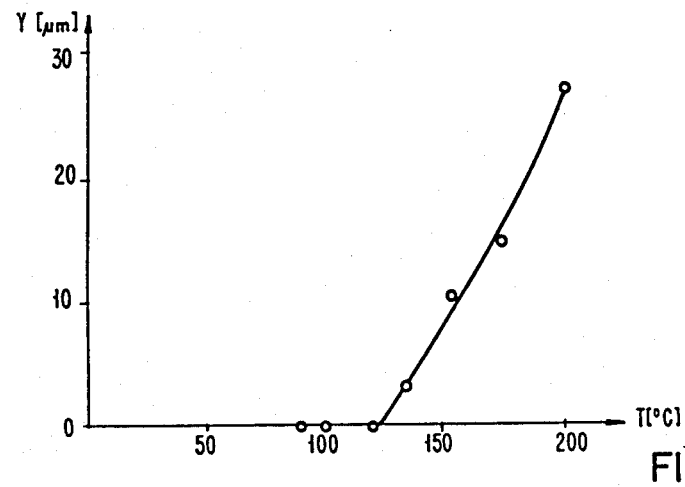
FIG. 6 is a diagram of the buckling of a mask membrane with an etch stop doping as a function of temperature, in accordance with prior art.

The diagram of FIG. 6 depicts such buckling of the silicon membrane vertically with respect to the mask surface as a function of the heating temperature. Consequently, determining the absence of tension in the silicon membrane requires a method by which the knee of the curve in FIG. 6 can be determined. It has been found that knee can be defined precisely by placing a silicon wafer with a highly boron-doped membrane under a microscope, focusing it, with the membrane center being observed, and subsequently healing it slowly. As soon as buckling begins, the previously sharp image is suddenly blurred. If the absence of tension is to be determined at room temperature, the membrane should first be cooled and then gradually heated to room temperature.

By means of this test method it is easy to ascertain, through an uncomplicated test series, the arsenic or germanium quantity with which the highly boron-doped layer in the mask structure has to be doped to make it tension-free at room temperature. In a 2 $\mu$m thick boron-doped layer whose boron concentration, as mentioned above, is $7 \times 10^{19}$ boron atoms/cm$^3$, the lower side of the layer requires e.g. a germanium concentration of approximately $8 \times 10^2$ atoms/cm$^3$. The counter-doping is performed conveniently by means of ion implantation or diffusion. After the mask structure has thus been rendered tension-free it is not yet equipped for practical use, i.e. for irradiation with a sufficiently high beam current for a throughput required in production under manufacturing conditions.

In the electron beam lithography processes using the mask as described herein, an electron beam is employed for mask irradiation which is rapidly scanned over the mask. The resultant heating of the thin membrane corresponds to that of flood light heating. Owing to the relatively high heat dissipation over the unetched silicon wafer regions acting as a frame for the silicon membrane, a temperature distribution in the silicon membrane is reached which has its maximum in the membrane center.

The continuous curve in FIG. 3 depicts schematically, for a cross-section through the mask membrane, the temperature difference profile, with respect to the membrane periphery temperature, which is formed over the silicon membrane. If the silicon membrane rendered tension-free in the preceding process step by means of doping would be exposed to such a beam current, it would buckle owing to the build-up in pressure or tension. In order to prevent the build-up of this pressure or tension, in the subsequent process step, the silicon membrane is doped non-uniformly, with a tension stress-generating material tuned to a predetermined beam current. For doping, materials which have a smaller covalent atomic diameter than silicon can be used. In particular these materials include boron, as well as phosphorus and carbon.

There exists a linear correlation between the temperature differences encountered during irradiation and the tensile stress which they can compensate. On the other hand, there exists an almost linear correlation between the doping concentration and the local tensile stress induced thereby particularly in the doping range from $10^{19}$ to $10^{20}$ boron atoms/cm$^3$ in silicon. If the temperature is distributed as depicted in FIG. 4, it is possible to make the mask tension-free by means of boron doping, whose profile, over the same cross-section through the membrane, shows a course geometrically similar to the temperature difference. These relations are illustrated by curve b in FIG. 3. Such doping can be produced in particular by ion implantation, with the boron ion beam when scanning over the silicon membrane being computer-controlled in its intensity or speed in such a manner that there results a concentration distribution of the boron in the silicon membrane which represents a transformation of the two-dimensional doping profile, as e.g. in FIG. 4, into the three-dimensional mode. The doping profiles of FIGS. 3 (see curve b) and 4 approximately follow a parabolic function. It is therefore easy to ascertain, in a simple test series the control data for generating the doping distribution necessary for the absence of tension with a predetermined beam current.

Figure 7A:
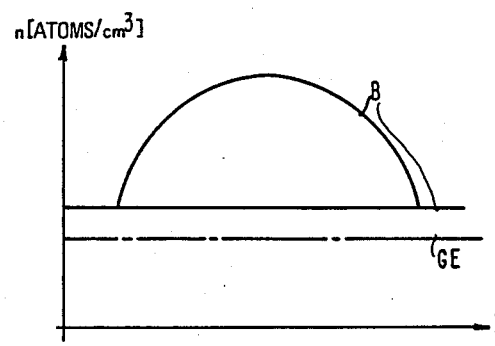
FIG. 7A-7C are diagrams of B and, optionally, Ge doping profiles plotted as a function of cross sections through the membrane in three embodiments of the mask in accordance with this invention.

FIG. 7A depicts in a schematic illustration, over a cross-section through the silicon membrane, the doping profiles produced upon the three dopings implemented during the above described mask generation, i.e.

1. The first, laterally homogeneous boron diffusion to effect the etch stop,

2. The germanium doping to compensate the tensions upon room temperature, and finally 3. The second boron diffusion to produce a tension-free mask during the irradiation of the silicon membrane with a predetermined beam current (laterally inhomogeneous doping profile).

To make sure that the finished mask is really tension-free with the predetermined beam current, it is irradiated with the predetermined beam current during the above-described microscopic tension measurement.

In the non-uniform doping by means of diffusion, the silicon membrane is heated e.g. by sending current through it, or by corresponding heat irradiation, with considerable temperature differences between the center and the periphery of the membrane owing to the different distance to the highly heat-dissipating frame. Thus, if the silicon membrane is exposed to the diffusion source, the desired non-uniform doping is reached on the basis of the different diffusion rates which develop due to the temperature differences.

For producing a mask of the design illustrated in FIG. 1, the doping steps can also be implemented in such a manner that doping profiles differing from those of FIG. 7A are obtained.

Figure 7B:
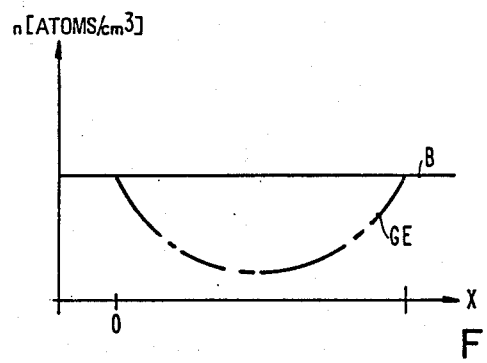
Figure 7C:
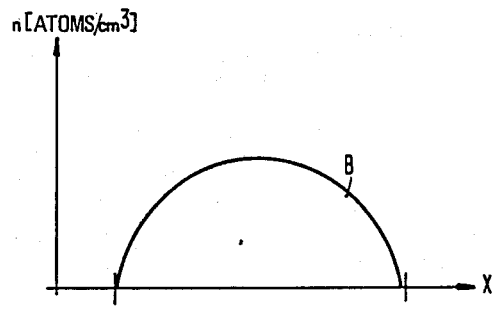

For example the profiles of FIG. 7B were obtained in that the first boron doping is not followed by a second doping rendering the mask tension-free at room temperature, but the second doping with a material with a higher covalent atomic diameter than silicon, e.g. germanium, the silicon membrane is non-uniformly counter-doped so that the germanium has a maximum in the silicon membrane periphery, and a minimum in the center (that means, an inhomogeneous germanium profile is produced which is inverse to the inhomogeneous boron profile of FIG. 7A). The concentrations of boron and germanium are tuned to each other in such a way that the resulting concentration distribution of the uncompensated boron equals the distribution achieved by three dopings—as illustrated in connection with FIG. 7A. The doping profile of FIG. 7C can be made in that for producing the absence of tension at room temperature there is no counter-doping, but that the high boron doping existing after the first doping is diffused out after thinning. Subsequently, non-uniform boron doping is produced as described above.

The production of a mask of FIG. 2 differs from the production of the embodiment of FIG. 1 only in that the mask pattern is not etched into the highly boron-doped layer but into a metal coating deposited on the silicon membrane. This alternative of the method is known and described e.g. in U.S. Pat. No. 3,742,230.

What is claimed is:

1. A mask for radiation beam lithography comprising a membrane of semiconductor material having a pair of opposing surfaces and a center and a periphery about said center, said membrane having a laterally inhomogeneous doping profile across said membrane from said periphery of said membrane to said center of said membrane to said periphery of said membrane on the opposite side of said center, said doping concentration being maximum at said center of said membrane and said doping concentration being at a minimum at said periphery of said membrane, said doping concentration varying from the periphery of said membrane to the center of said membrane and to the periphery of said membrane on the opposite side of said center as substantially a parabolic function.

2. A mask for radiation beam lithography in accordance with claim 1 wherein said membrane having been treated to have a laterally inhomogeneous doping profile across said membrane from said periphery of said membrane to said center to said periphery on the opposite side of the center by as follows:

(a) additively doping with a nonuniform doping concentration of a doping element, or (b) subtractively out-diffusing already built-in-atoms.

3. A mask for radiation beam lithography in accordance with claim 1 wherein said doping concentration varies from the periphery to the center of said membrane by an amount of the order of $10^{19}$ to $10^{20}$ atoms/cm$^3$.

4. A mask for radiation beam lithography in accordance with claim 3 wherein said membrane of semiconductor material comprises silicon, and said doping element is selected from the group consisting of boron, phosphorous and carbon.

5. A mask for radiation beam lithography comprising a semiconductor wafer having a pair of opposing surfaces, said wafer having a differently doped layer at least in regions form a first one of said opposing surfaces down to a predetermined depth spaced from the second one of said opposing surfaces, said wafer having been etched to leave a membrane of said differently doped layer, said membrane having a tensile-stress-generating doping which is nonuniform in doping concentration over the surface of said membrane with said doping concentration being minimum at the periphery of said membrane and at a maximum at its center, said doping concentration varying from the periphery of said membrane to the center of said membrane and to the periphery of said membrane on the opposite side of said center as substantially a parabolic function.

6. A mask in accordance with claim 5 wherein said membrane has a thickness on the order of 2 μm–3 μm.

7. A mask for ion, electron or x-ray lithography, which comprises a semiconductor wafer having top and bottom surfaces
said wafer having a differently doped layer at least in regions from said top surface of said wafer down to a depth of 2–3 μm from the said bottom surface of said wafer,
said wafer being selectively etched from said bottom surface down to said bottom said differently doped layer thereby forming a thin membrane in the process, and
a hole pattern defining a mask pattern being etched either into said membrane or into a layer deposited on said membrane,
said membrane having a tensile-stress-generating doping material which is nonuniform in doping concentration over said membrane, with said doping concentration being at a minimum in the periphery of said membrane and at a maximum in its center, said doping concentration varying from the periphery of said membrane to the center of said membrane and to the periphery of said membrane on the opposite side of said center as substantially a parabolic function.

8. A mask in accordance with claim 7 characterized in that the concentration distribution of said tensile-stress-generating doping over said membrane is directly proportional to the temperature distribution during irradiation with electron, ion or X-ray beams in said membrane.

9. A mask in accordance with claim 7 where in said membrane is about 22×11 mm² and about 2 μm thick, that the overall hole surface amounts to 40% of the membrane surface and that it is tension-free if exposed to a beam current of 10 microamperes, and in that the non-compensated boron doping in the center of said membrane is higher than in its periphery by an amount (in $10^{19}$ atoms/cm³) which is in a ratio of approximately 3:20 to the beam current in microamperes to be used.

10. A mask in accordance with claim 7 in that the effect of said doping material is partly compensated by a stress relieving doping material for eliminating the tensile stress, said stress relieving doping material having in silicon a greater covalent atomic radius than silicon.

11. A mask in accordance with claim 10, said doping material comprising a material selected from the group consisting of arsenic and germanium.

12. A mask in accordance with claim 7, wherein said semiconductor wafer consists of silicon.

13. A mask in accordance with claim 12 characterized in that the concentration distribution of said tensile-stress-generating doping over the membrane is directly proportional to the temperature distribution during irradiation with electron, ion or X-ray beams in the membrane.

14. A mask as claimed in claim 12, including as said doping material a tensile-stress-generating doping material at least one element with a smaller covalent atomic radius than silicon, selected from the group consisting of boron, carbon and phosphorus.

15. A mask in accordance with claim 14 characterized in that the concentration distribution of the tensile stress-generating doping over the membrane is directly proportional to the temperature distribution during irradiation with electron, ion or X-ray beams in the membrane.

16. A method of making a mask wherein a semiconductor wafer having a pair of opposing surfaces is differently doped to form a differently doped layer from one of said surfaces to a depth of 2–3 μm with respect to the remaining portion of said semiconductor wafer,
where, from the opposite surface, said wafer is selectively etched down to said differently doped layer, with a membrane being formed in the process,
etching a pattern of hole defining the mask pattern in said membrane, or into said semiconductor wafer where said membrane is to be formed respectively into a mask, or into a layer deposited on said membrane,
said membrane being treated to have a laterally inhomogeneous doping profile to have minimum stress at the periphery of said membrane and maximum stress in the center of said membrane by means of an additional doping or out-diffusion to eliminate mechanical tensions produced through the first doping, and/or an additional non-uniform doping, said doping profile varying from the periphery of said membrane to the center of said membrane and to the periphery of said membrane on the opposite side of said center as substantially a parabolic function,
whereby said inhomogeneous doping profile generates a tension stress being proportional to the temperature distribution developing thereover in the irradiation with ion, electron or x-rays.

17. A method claimed in claim 16, wherein a p-doped or n-doped silicon wafer is, first, doped with boron to a depth of 2–3 μm,
for partly compensating said boron doping there follows an additional non-uniform doping with a material selected from the group consisting of germanium, indium, arsenic and antimony, in such a manner that the concentration profile of the additional doping over said membrane is proportional to the inverse temperature distribution over said membrane developing in the irradiation with ion, electron or X-rays, with the additional doping having a minimum in the center of said membrane, and a maximum at the periphery.

18. A method in accordance with claim 16, wherein additional non-uniform doping is implemented by means of ion implantation, with the ion beam scanning said membrane, and that either the intensity of the beam or the speed of its motion is varied under computer control in accordance with the desired doping profile.

19. A method as claimed in claim 16, wherein p-doped or n-doped silicon wafer is, first, p+-doped with boron to a depth of 2–3 μm,
following the producing of said membrane said boron doping is compensated by a doping with a material selected from the group consisting of germanium, indium, arsenic and antimony until absence of tension at room temperature, and said membrane being non-uniformly doped with a material selected from the group consisting of boron, carbon, phosphorus, in such a manner that the concentration distribution over said membrane developing during the non-uniform doping is proportional to the temperature distribution existing thereover in the irradiation in the electron or X-rays.

20. A method in accordance with claim 19, wherein doping is effected in such a manner that for the predetermined beam current the residual tension in said membrane is between zero and that tension which causes a maximum distortion in said membrane of approximately 10 nm.

* * * * *